United States Patent [19]

Fontana, Jr. et al.

[11] Patent Number: 5,240,166
[45] Date of Patent: Aug. 31, 1993

[54] DEVICE FOR THERMALLY ENHANCED ULTRASONIC BONDING WITH LOCALIZED HEAT PULSES

[75] Inventors: Robert E. Fontana, Jr., San Jose; Linda H. Lane, Gilroy; Celia E. Yeack-Scranton, San Jose, all of Calif.

[73] Assignee: International Business Machines Corporation, Armonk, N.Y.

[21] Appl. No.: 884,497

[22] Filed: May 15, 1992

[51] Int. Cl.5 .............................................. B23K 20/10
[52] U.S. Cl. ..................... 228/111.5; 228/1.1; 219/85.16; 219/85.18
[58] Field of Search ................ 228/110, 179, 1.1, 4.5, 228/51; 219/85.16, 85.18, 229, 233; 156/73.1, 580.1, 580.2

[56] References Cited

U.S. PATENT DOCUMENTS

| | | | |
|---|---|---|---|
| 3,146,141 | 8/1964 | Woodland | 156/73 |
| 3,454,450 | 7/1969 | Tyrrell | 156/499 |
| 3,533,155 | 10/1970 | Coucoulas | 29/471.1 |
| 3,614,832 | 10/1971 | Chance et al. | 29/626 |
| 3,625,783 | 12/1971 | Coucoulas | 156/73 |
| 3,711,341 | 1/1973 | Joshi et al. | 148/126 |
| 4,040,885 | 8/1977 | Hight et al. | 156/378 |
| 4,296,309 | 10/1981 | Shinmi et al. | 219/543 |
| 4,315,128 | 2/1982 | Matcovich et al. | 228/4.5 |
| 4,529,115 | 7/1985 | Renshaw et al. | 228/1.1 |
| 4,534,811 | 8/1985 | Ainslie et al. | 156/73.1 |
| 4,619,397 | 10/1986 | Urban | 228/111 |
| 4,776,509 | 10/1988 | Pitts et al. | 228/179 |
| 4,778,097 | 10/1988 | Hauser | 228/44.7 |
| 4,842,662 | 6/1989 | Jacobi | 156/633 |
| 5,019,201 | 5/1991 | Yabu et al. | 156/273.9 |
| 5,044,543 | 9/1991 | Yamazaki et al. | 228/110 |

Primary Examiner—Samuel M. Heinrich
Attorney, Agent, or Firm—J. C. Pintner; L. C. Chang

[57] ABSTRACT

A single point bonding tool for use in ultrasonically bonding a fine or ultrafine wire to another electrical conductor, has a thin film resistor integrally formed thereon. The thin film resistor is integrally formed on the bonding tip by standard photolithographic techniques applied to the bonding tool. The tool combines ultrasonic energy and thermal energy provided by the resistor to provide required bonding energy that may be localized both in space and in time. The result offers optimized energy transfer to the selected workpieces and minimizes risk of damage to adjacent, heat sensitive devices.

20 Claims, 4 Drawing Sheets

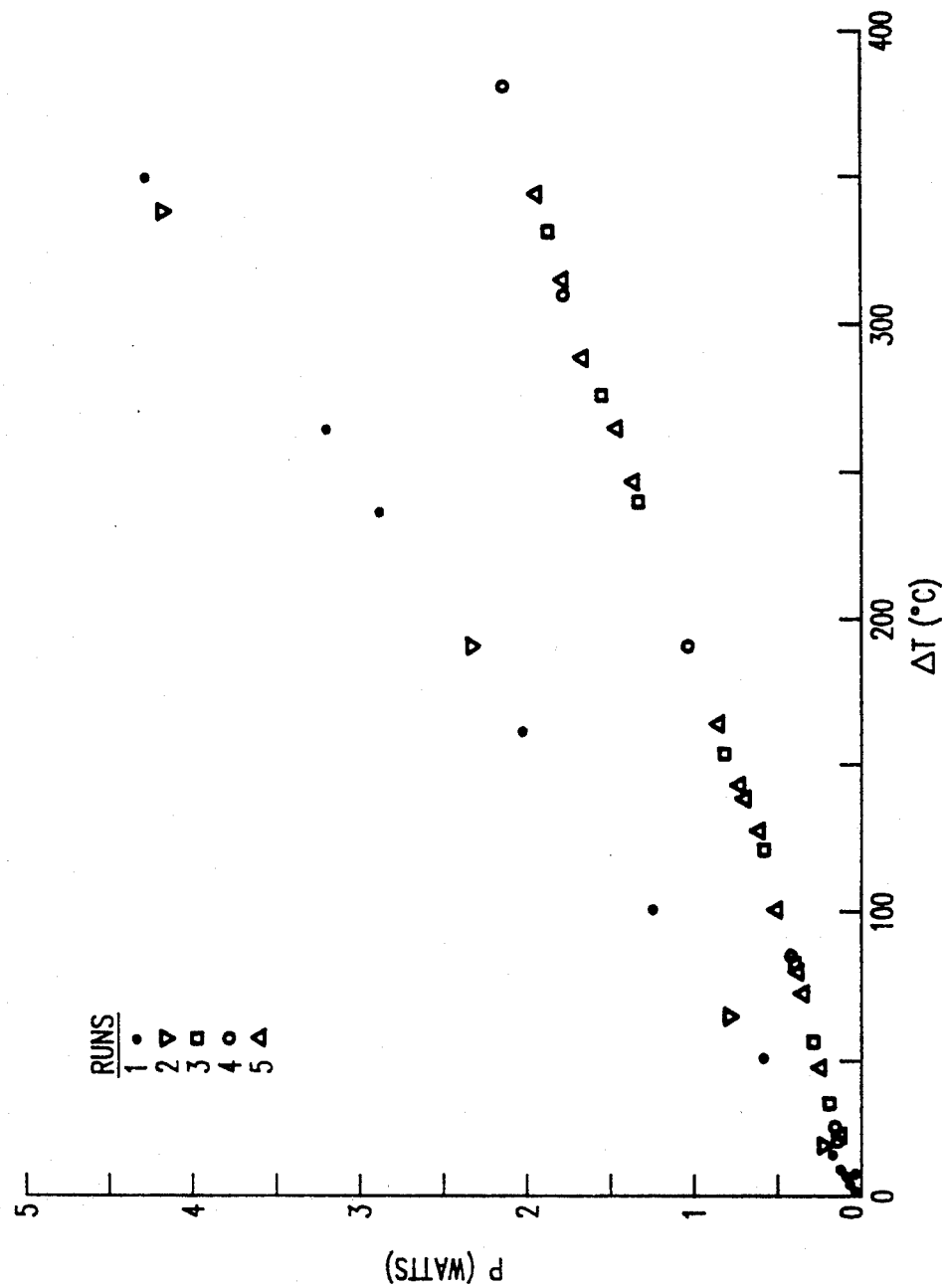

DEVICE FOR THERMALLY ENHANCED ULTRASONIC BONDING WITH LOCALIZED HEAT PULSES

FIELD OF INVENTION

The present invention relates generally to a thermally enhanced ultrasonic vibratory bonding device and a process of manufacture of said device. The invention further relates to a device wherein the temperature of the bonding tip is controlled during the bonding operation to insure that bonds formed thereby are generally uniform in size, shape and strength.

BACKGROUND OF THE INVENTION

Ultrasonic bonding or welding is a metallurgical joining technique which utilizes high frequency vibrations disrupting the surface films and oxides thereby promoting interatomic diffusion and flow between the surfaces in contact. Briefly stated, the ultrasonic bonding or welding process consists of clamping or otherwise securing together selected work pieces under moderate pressure between a bonding or welding tip and a support and then introducing high frequency vibratory energy into the tip for a relatively short period of time, i.e. from a fraction of a second to a number of seconds. A brief application of ultrasonic vibratory energy in a direction substantially parallel to the workpiece surfaces makes the bond. The lateral motion of the first workpiece surface over the second workpiece surface breaks up films thereon to provide a nascent bonding surface. The parameters of force, time, temperature and ultrasonic energy generate heat at the interface of the workpiece surfaces, combine to create a nascent surface, and produce a true metallurgical bond. The key to the success of this process is the use of unique bonding tools designed to transfer ultrasonic energy and heat into the workpieces efficiently and repeatedly.

The combined use of heat and ultrasonic vibrations for the purpose of sealing, bonding or welding two or more similar or dissimilar materials was initially limited to use on thermoplastics, non-woven fabrics and metals where weld strength and integrity were not particularly important.

The use of ultrasonic bonding has been accompanied by certain problems. Those problems include, while not necessarily limited to, inefficient transfer of ultrasonic energy to selected workpieces and difficulty in establishing, controlling, and maintaining an optimal temperature of the bonding tip to ensure repeatable satisfactory resultant bonds. To that end, improvements in bonding tools to maximize ultrasonic energy transfer include those disclosed in U.S. Pat. No. 4,776,509 and U.S. Pat. No. 4,778,097. Thermally assisted ultrasonic devices employing, for example, an electric resistance heating element (U.S. Pat. No. 4,529,115) or a laser light source (U.S. Pat. No. 4,534,811) were developed.

Referring to U.S. Pat. No. 4,776,509, improvements to a bonding tip include a multiple of nonparallel surfaces extending from the end of the tip for maximizing the amount of ultrasonic energy coupled to the electrical conductors or workpieces. The surfaces may be recessed into the tip or protrude outwardly from the end of the tip for coupling ultrasonic energy in directions both parallel and perpendicular to the conductors. In U.S. Pat. No. 4,778,097, the bonding tip provides a channel or groove for holding the wire against the pad. The tip has a central concave surface whose cross-sectional shape approximates a minor portion of the wire's cross-sectional shape both as to geometry and as to dimension.

Referring to U.S. Pat. No. 4,529,115, as representative, conventional thermally assisted ultrasonic bonding devices typically include an electric resistance coil wrapped around the bonding or welding tip. The resistance coil serves to thermally assist in establishing and maintaining an optimum welding tip temperature. In order to insure and provide for maximum heat transfer between a resistance coil and welding tip, kapton tape is provided to cover and isolate the resistance coils. However, a limitation of this reference is that the thermal mass being heated is very large compared to the specific area of the desired bond or weld. The efficiency of the heat transfer between resistance coil and welding tip is limited, in part, to the integrity of the insulating tape. In addition, an elevated static temperature of the thermal mass poses a safety hazard, or can be potentially degrading to the operability of adjacent or integral heat sensitive components. The cumulative result of these limitations is that a thermally enhanced ultrasonic welding arrangement of this sort does not provide a desirable bonding for fine or superfine wires, for optical device components or for devices having heat sensitive circuit elements.

Referring now to U.S. Pat. No. 4,534,811, as representative, a conventional laser-assisted ultrasonic bonding device (sometimes referred to as laser-sonic bonding device) is implemented using a laser and a hollow ultrasonic bonding tip. The combination of the laser and the ultrasonic bonding tip offers the ability to dynamically provide localized heat in a short pulse at a limited bond area. The combination of ultrasonic bonding along with dynamic laser heat avoids several of the shortcomings of the thermally assisted implementation of U.S. Pat. No. 4,529,115. Namely, the thermal mass being heated may be significantly smaller inasmuch as an optimal temperature is attained via dynamic means through laser pulses. Tape, or other supplemental insulating or bonding means, is not required. In addition, the dynamic application of optimal heat for the purpose of welding or bonding minimizes the probability of damage to adjacent or integral heat sensitive devices. However, the expense and complexity of a laser is high, the tips are very expensive and incompatible with some bonding processes, and optical fibers used to transmit the laser source must be repolished approximately after every 1000 bonds.

There is a need in the art, therefore, for a bonding tip providing required bonding energy without sustained heating of the bonding tip thermal mass that may result in damage to adjacent heat-sensitive components. The needed bonding tip is preferably one that is usable with a known bonding method or apparatus. The needed bonding tip further is preferably relatively inexpensive to manufacture. Embodiments of the various aspects of the invention addressing these needs will now be described, by way of drawings and examples.

SUMMARY OF THE INVENTION

In view of the foregoing, it is therefore an object of the invention to provide an ultrasonic bonding tip and device by means of which fine or superfine wire or circuit elements can be bonded to form a connection which is of high electrical conductivity, good mechanical strength and excellent metallurgical compatibility.

It is yet object of this invention to provide a bonding method which insures uniform bond characteristics from one bond to another.

It is still another object of the invention to provide a relatively inexpensive process of manufacturing a thermally enhanced ultrasonic bonding device.

The bonding tip of this invention is adapted to move with respect to ultrafine wire, tape or other material to be bonded to a circuit element or workpiece in preparation for bonding. Resistance-heating means (e.g., a resistive layer) is provided on the surface of the bonding tip to for generating localized heat at the bonding tip. A control means may further be provided for monitoring the temperature of the bonding tip during a particular bonding cycle to insure that the temperature of said elements remain within a pre-determined range.

The foregoing and other objects, features and advantages of the invention will be apparent from the following more particular description of preferred embodiments of the invention, as illustrated in accompanying drawings.

DESCRIPTION OF DRAWINGS

FIGS. 3A and 3B are graphical representations of thin film resistor temperatures vs. applied power for thin film resistors.

DETAILED DESCRIPTION OF THE INVENTION

Figure 1:
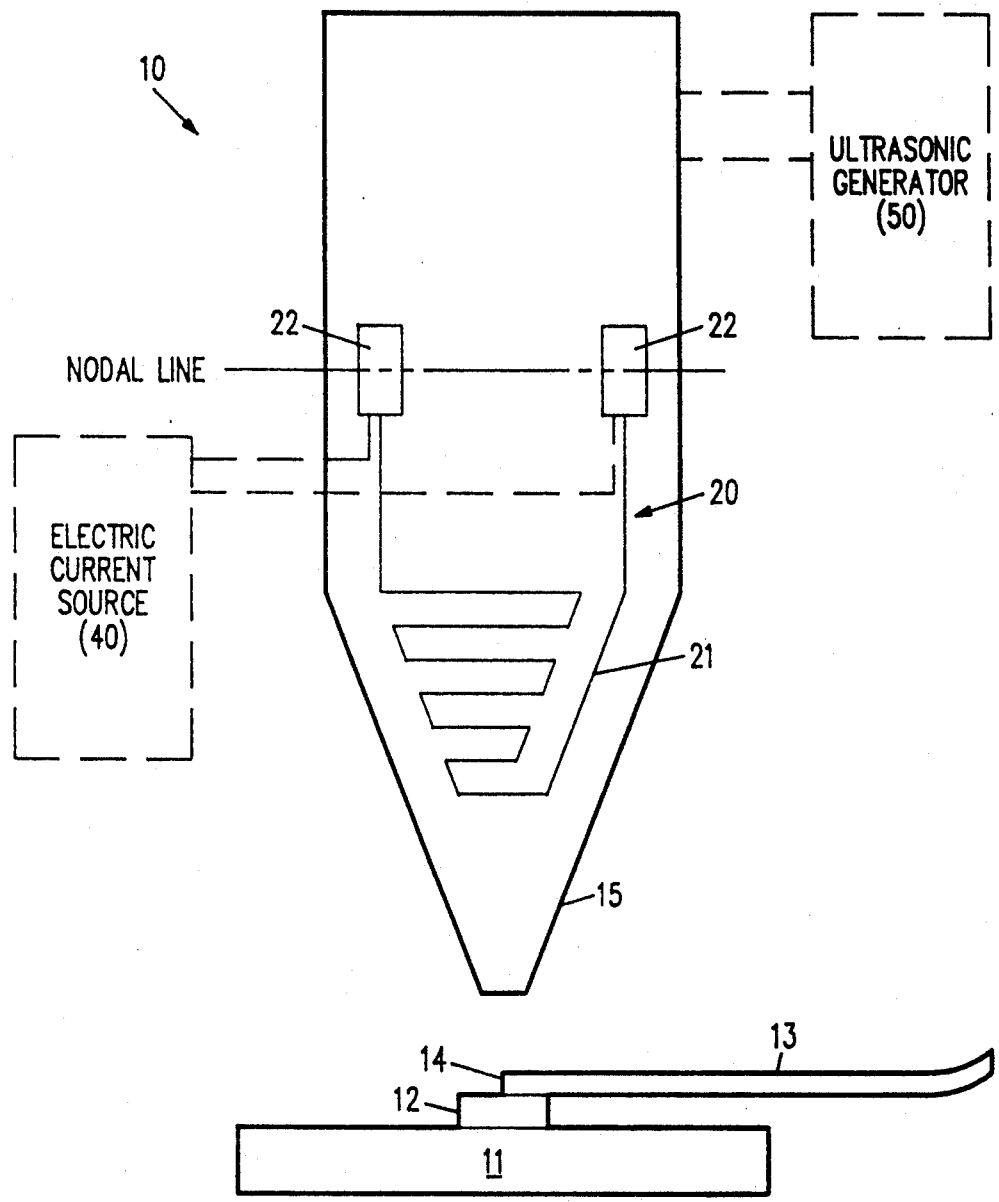
FIG. 1 is an illustration of the thermally enhanced ultrasonic bonding tip apparatus of the present invention.

An ultrasonic bonding device (10) capable of bonding elements (12) and (13) is illustrated in FIG. 1. As illustrated in FIG. 1, the bonding tip (15) has a first end that is generally cylindrical in shape and further has a tapered bonding end that is disposed longitudinally opposite to the first end. The general characteristics of the shape of the bonding tip is not limited to that illustrated in FIG. 1, and alternatively may comprise any tapered or wedge-shaped body and may further embody modifications to improve the coupling of ultrasonic energy to the bonding tip (15).

As further illustrated in FIG. 1, the bonding tip (15) further includes a thin film resistor (20). The thin film resistor (20) comprises a conductor path (21), which serves as a path for current flow, and at least two contact points (22), of greater width than the conductor path. The thin film resistor (20) is connected at its contact points (22) to an external electric current source (40). In the preferred embodiment, the width and surface area of the contact points (22) is greater that that of the conductor path (21) in order to facilitate the connection to the external electric source (40).

As illustrated in FIG. 1, the elements (12) and (13), which are to be bonded, are positioned beneath the bonding tip (15). The end of the tip (15) is positioned over a joint (14) to be bonded. One element (12) of the joint (14) may comprise a contact pad on an integrated circuit (11) or an optical coupler. The remaining element (13) may be ultrafine wire, tape, optical fiber or other material to be bonded to the element (12). The tip (15) is moved in the vertical direction until in contact with either or both of the elements (12) and (13) to be bonded at the joint (14). The elements (12) and (13) are held together under moderate pressure, by clamping or by otherwise securing together.

Figure 2:
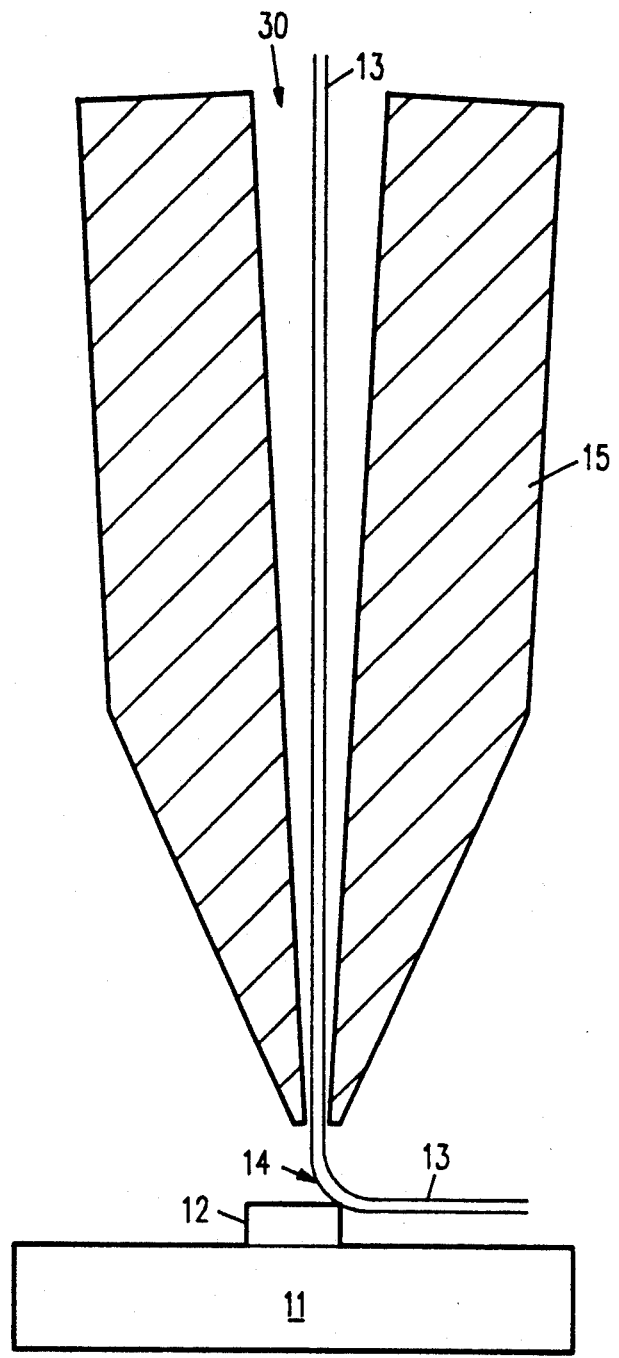
FIG. 2 shows in cross section another representation of the bonding tip in FIG. 1, including an aperture to facilitate in guiding the wire element to be bonded.

FIG. 2 illustrates another embodiment, wherein the bonding tip (15) further includes an aperture (30) that may accommodate a strand of wire (13). Positioning of the wire element (13) may be facilitated by the aperture (30) in the bonding tip (15) illustrated in FIG. 2.

Referring again to FIG. 1, an ultrasonic generator (50) applies ultrasonic energy to the bonding tip (15), and the current source (40) simultaneously applies a current pulse to the thin film resistor (20). The ultrasonic vibratory energy is substantially in the horizontal direction. By pulsing or otherwise varying the electric current, the bonding end of the bonding tip (15) absorbs the heat generated by the thin film resistor (20) to raise the temperature of the bonding tip (15). The energy necessary to bond elements (12) and (13) at the joint (14) is generated by the combination of the ultrasonic vibratory energy and the heat generated by the thin film resistor (20). The resultant energy breaks up films on each of the elements (12) and (13) resulting in a nascent bonding surface at the joint (14). The result producing a true metallurgical bond. Alternatively, solder may be introduced at the joint (14), with the combination of ultrasonic vibratory energy and heat generated by the thin film resistor (20) necessary to melt the solder to form a solder reflow bond at the joint (14).

The strength of the bond is related to the amplitude of the bonding tip vibration that occurs while bonding. The frequency of vibration also produces a particular resonance characteristic of the bonding tip. The resonance characteristic produced depends, inter alia, on the nature of the bonding tip employed, including the length of the bonding tip itself.

During the manufacturing process, the contact points (22) may be formed at the position where a nodal or anti-nodal point occurs on the bonding tip (15). It is preferable to form the contact points (22) at the nodal point because this corresponds to a position of maximum stress and minimum strain. Forming the contact points (22) at an anti-nodal point, that is at a location of maximum strain and minimum stress, has the relative disadvantage that a larger vibrational amplitude exists at this point and problems can arise in connection integrity with possible detachment of the contact points (22) from the bonding tip (15) and/or fatigue stressing of the contact points (22) themselves.

By pulsing or otherwise varying the electric current through the resistor disposed on the end of the bonding tip, the heat enhancing the bonding tip (15) is localized in space and time. Thus, a heat pulse with a time duration shorter than the thermal diffusion time from the nascent bonding surface at the joint (14) to an adjacent, heat sensitive component (not shown) on the integrated circuit (11) may prevent damage to that adjacent, heat sensitive component.

Because thermal diffusion times for a typical circuit substrate ranges in tens of milliseconds, the current pulse can thus be shaped or timed along with the ultrasonic process to optimize bonding. In addition, the temperature can be sensed using the resistance change in the resistor itself, a separate magneto resistive sensor deposited nearby, and/or a thermocouple at the bonding tip (15) or circuit element (12). The sensed temperature can then be used as part of a control means to limit or shape power, voltage or current to the heater and to insure uniform bond characteristics.

Figure 3B:
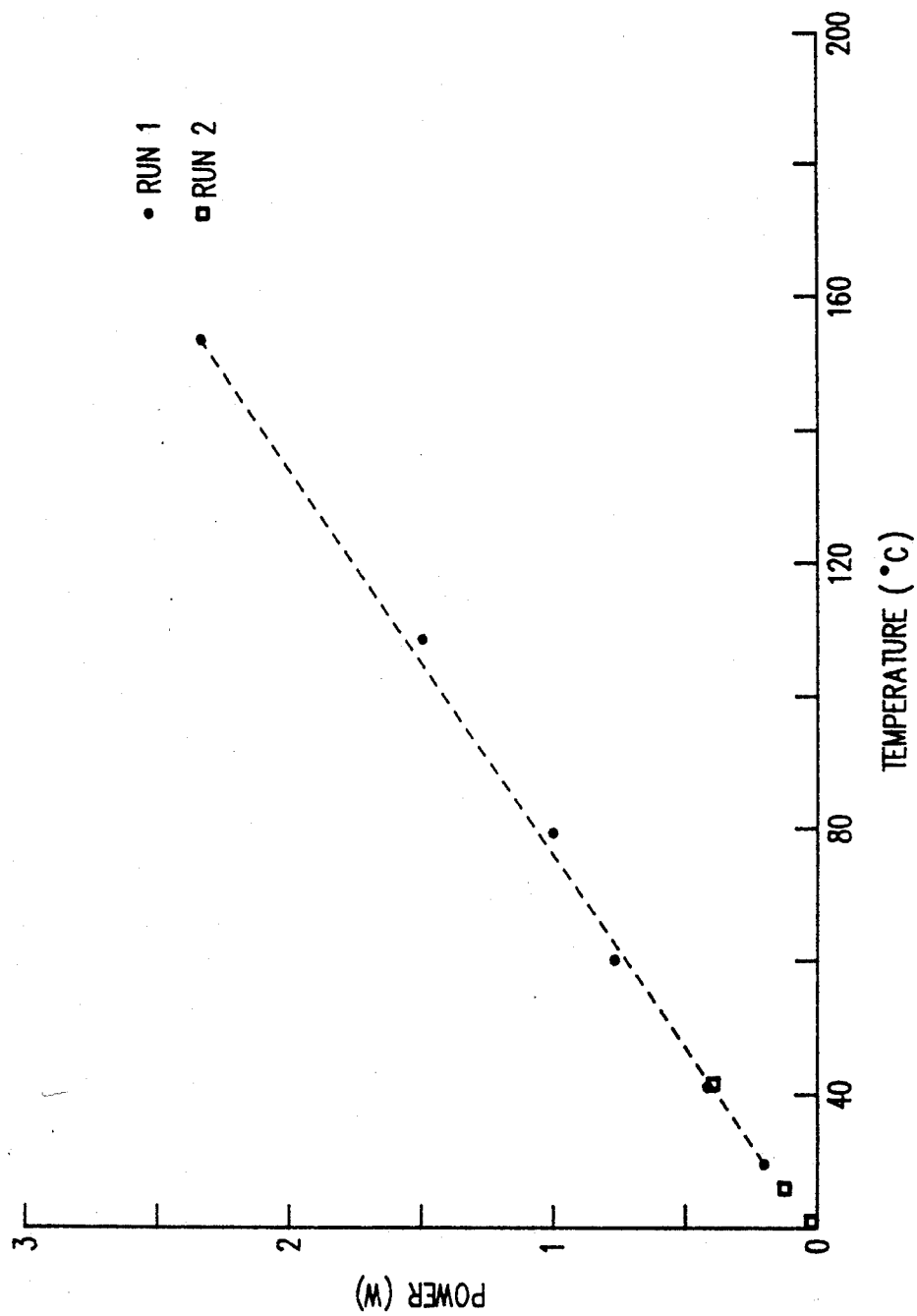

FIG. 3A represents a compilation of data taken for resistors deposited on alumina-titanium-carbide wafers and covering from 0.25 mm square to 0.5 mm square. Specifically, 0.5 mm square resistors are used to melt a glass bonding agent (M.P. 320° C.) in Run 1 and Run 2, while the glass bonding agent, a solder, and a wax bonding agent are melted by 0.25 mm square resistors in Runs 3, 4 and 5, respectively. FIG. 3B represents data taken from two runs with resistors deposited on actual bonding tips. Due to the details of materials, shape, resistor design, etc., the average power required to heat to the desired temperature is 1-3 Watts. To ensure that the tip heats only the volume of material required for bonding, that power is pulsed at time intervals on an order of magnitude less that the thermal diffusion times of adjacent, heat sensitive circuit elements. A means of controlling the bonding energy is to monitor the resistance change of the heater resistor (20) during the bonding process. For a given resistor material, resistance change can be directly related to temperature change. Also in some bonding schemes, for instance, where plastic or solder is locally melted during the bonding process, the resistance may change abruptly due to the better thermal transfer of heat to a liquid interface versus to a solid interface.

A thin film resistor (20) may be formed on the conventional bonding tip according to known photolithographic techniques as hereafter described.

The surface of the bonding tip (15) is first coated with an insulating material, such as alumina or silicon dioxide. The material may be deposited by a sputtering technique and serves to isolate the thin film resistor (20) from the bonding tip (15) itself. In the preferred embodiment, the insulating layer is approximately 0.5 micron in depth. An alternative insulating material is polyimide, which may be coated onto the tip using a float-on process, a spin casting process, or other known techniques.

The bonding tip (15) is then coated with a thin metal conducting film. As with the insulating material, the conducting film may be deposited by a sputtering technique or evaporation. In the preferred embodiment the conducting film is approximately 0.05 to 1 micron in depth and may consist of gold (Au), tantalum (Ta), or chromium (Cr).

The bonding tip (15) is then coated with a photoresist according to techniques known and available. The geometry of the bonding tip (15) makes it difficult to spin on photoresist, but a float-on process can be used. The photoresist is likewise exposed, using a mask, onto a flat region on the bonding tip in order to transfer a desired image or pattern of the resistor (20) onto the photoresist. The exposed photoresist is subsequently developed and removed leaving only the unexposed photoresist. In the preferred embodiment, an aqueous base solution is used for the developing process and is likewise according to known and available techniques.

The surface of the bonding tip (15) is then etched in order to remove the thin metal conducting film at the areas of the removed photoresist. In the preferred embodiment typical etching techniques may be used and include chemical etching, sputter etching, or ion beam milling.

Finally, the remaining photoresist covering the thin metal film is removed or stripped. Again, the process is according to known and available techniques. In the preferred embodiment solvents such as acetone or isopropol alcohol are used.

The typical surface of a bonding tip limits the features of the above described process to about 20 microns and above. Beading of the photoresist occurs within 50 microns of the tip. Thus, the pattern should be limited to greater than 50 microns from the tip and/or a wicking or alternate photolithographic process should be used to prevent beading.

Thus, there has been described an apparatus and method in accordance with one embodiment of the invention for generating a bonding tip temperature for use in thermocompression, ultrasonic and thermosonic processes. Those skilled in the art will recognize yet other embodiments within the scope of the claims which follow.

We claim:

1. A bonding apparatus comprising:
a bonding tip, an insulating film disposed on said bonding tip, and a thin film resistor disposed on said insulating film.

2. A bonding apparatus comprising:
a bonding tip, and a patterned thin film resistor integrally disposed on said bonding tip,
said patterned thin film resistor including a pair of contact points and a conductor path electrically connecting said contact points.

3. A bonding apparatus comprising a bonding tip and a thin film resistor, wherein:
said bonding tip includes a bonding end;
said thin film resistor includes a pair of contact points and a conductor path electrically connecting said contact points, said contact points and said conductor path integrally formed on said bonding tip; and
said contact points are disposed approximately at a nodal line of said bonding tip, and said conductor path is disposed on said bonding end of said bonding tip.

4. The apparatus of claim 1, further comprising:
a source of electrical power for producing an electric current, said thin film resistor receiving said electric current to heat said bonding tip, and a source of ultrasonic bonding energy coupled to said bonding tip.

5. The apparatus of claim 2, further comprising:
a source of electrical power for producing an electric current, said thin film resistor receiving said electric current to heat said bonding tip, and a source of ultrasonic bonding energy coupled to said bonding tip.

6. The apparatus of claim 3, further comprising:
a source of electrical power for producing an electric current, said thin film resistor receiving said electric current to heat said bonding tip, and a source of ultrasonic bonding energy coupled to said bonding tip.

7. The apparatus of claim 4, wherein:
said electric current is pulsed.

8. The apparatus of claim 5, wherein:
said electric current is pulsed.

9. The apparatus of claim 6, wherein:
said electric current is pulsed.

10. The apparatus of claim 4, further comprising:
a means for controlling at least one of said electrical power and said ultrasonic bonding energy.

11. The apparatus of claim 5, further comprising:
a means for controlling at least one of said electrical power and said ultrasonic bonding energy.

12. The apparatus of claim 6, further comprising:

a means for controlling at least one of said electrical power and said ultrasonic bonding energy.

13. The apparatus of claim 7, further comprising:
a means for controlling at least one of said electrical power and said ultrasonic bonding energy.

14. The apparatus of claim 8, further comprising:
a means for controlling at least one of said electrical power and said ultrasonic bonding energy.

15. The apparatus of claim 9, further comprising:
a means for controlling at least one of said electrical power and said ultrasonic bonding energy.

16. The apparatus of claim 1, wherein:
said bonding tip further includes an aperture disposed within said bonding tip.

17. The apparatus of claim 2, wherein:
said bonding tip further includes an aperture disposed within said bonding tip.

18. The apparatus of claim 3, wherein:
said bonding tip further includes an aperture disposed within said bonding tip.

19. A method for bonding two surfaces together comprising the steps of:
generating thermal energy at a bonding tip by passing an electric current through a thin film resistor on said bonding tip and applying ultrasonic energy to said bonding tip; and
transmitting said thermal energy and said ultrasonic energy to said two surfaces forming bonding of said two surfaces.

20. The method as in claim 19, wherein said step of generating thermal energy includes:
pulsing said electric current.

* * * * *